United States Patent
Liu et al.

(10) Patent No.: US 7,211,501 B2
(45) Date of Patent: May 1, 2007

(54) METHOD AND APPARATUS FOR LASER ANNEALING

(75) Inventors: Mark Y. Liu, Portland, OR (US); Mitchell Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/319,310

(22) Filed: Dec. 12, 2002

(65) Prior Publication Data

US 2004/0115931 A1  Jun. 17, 2004

(51) Int. Cl.
*H01L 21/425* (2006.01)

(52) U.S. Cl. ............... 438/530; 438/795; 257/21.135; 117/217

(58) Field of Classification Search ........ 257/E21.135; 438/530, 660, 661, 662, 795, 798, 799, 140; 117/217; 118/725
See application file for complete search history.

(56) References Cited

U.S. PATENT DOCUMENTS

| | | | |
|---|---|---|---|
| 5,371,381 A * | 12/1994 | Sugahara et al. ............ 257/75 |
| 5,474,940 A * | 12/1995 | Tsukamoto ................ 438/289 |
| 5,804,471 A * | 9/1998 | Yamazaki et al. .......... 438/154 |
| 6,191,044 B1 * | 2/2001 | Yu et al. .................... 438/713 |
| 6,214,675 B1 * | 4/2001 | Cochran et al. ............ 438/275 |
| 6,300,228 B1 * | 10/2001 | Adkisson et al. .......... 438/558 |
| 6,388,386 B1 * | 5/2002 | Kunii et al. ............. 315/169.3 |
| 6,514,840 B2 * | 2/2003 | Barrett et al. .............. 438/530 |
| 6,528,397 B1 * | 3/2003 | Taketomi et al. .......... 438/487 |
| 6,548,830 B1 * | 4/2003 | Noguchi et al. ............. 257/66 |
| 6,723,590 B1 * | 4/2004 | Zhang et al. .............. 438/166 |
| 2001/0018258 A1 * | 8/2001 | Yoon ........................ 438/530 |
| 2003/0040130 A1 * | 2/2003 | Mayur et al. ............... 438/14 |
| 2003/0060026 A1 * | 3/2003 | Yamazaki et al. .......... 438/479 |

\* cited by examiner

*Primary Examiner*—Caridad Everhart
(74) *Attorney, Agent, or Firm*—Blakely, Sokoloff, Taylor & Zafman LLP

(57) ABSTRACT

Numerous embodiments of a method and apparatus for laser annealing are disclosed. In one embodiment, a method of laser annealing includes performing one or more annealing processes on one or more portions of a semiconductor device, where one or more annealing processes performed on one or more portions of the semiconductor device are varied based at least in part on the particular portion of the semiconductor device being annealed, and/or on one or more desirable characteristics of the particular portion of the semiconductor device being annealed.

19 Claims, 3 Drawing Sheets

METHOD AND APPARATUS FOR LASER ANNEALING

BACKGROUND

As part of the fabrication process for semiconductor devices such as integrated circuits (ICs), these devices typically undergo a heat treating or thermal annealing process following implantation or doping of one or more components of the IC, such as transistors. Annealing may serve several purposes, including physical repair of the silicon lattice structure following doping, and activation of the dopant, resulting in formation of source/drain regions in the transistors. Several different annealing processes have been developed and implemented, but each technique carries with it certain disadvantages.

Rapid thermal annealing (RTA) and diffusion furnace annealing are two processes that may be utilized to anneal semiconductor devices. Both processes typically raise the temperature of the entire silicon wafer on which the device is fabricated for particular period of time using, for example, heat lamps, which radiate the doped wafer surface. However, the RTA and diffusion furnace processes may be time consuming as well as difficult to control, due at least in part to the nature of radiative heating processes.

Laser annealing is a more recent annealing process, which was developed to provide rapid annealing of semiconductor devices, as well as greater thermal control. However, state of the art laser annealing techniques may have certain limitations, and may be in need of improvement. A need exists for an improved method and apparatus for laser annealing.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Embodiments of the claimed subject matter may comprise a method and apparatus for laser annealing. One embodiment of the claimed subject matter may selectively anneal portions of one or more semiconductor devices residing on a silicon wafer, wherein selected portions of one or more devices may be exposed to differing laser fluence (energy per area), or pulse width (pulse time), for example. This may result, for example, in selected portions of a semiconductor device having different characteristics than other portions of the device, or differing semiconductor devices on the wafer having different characteristics. In this context, a semiconductor device may alternatively be referred to as a transistor or an integrated circuit (IC).

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Figure 1:
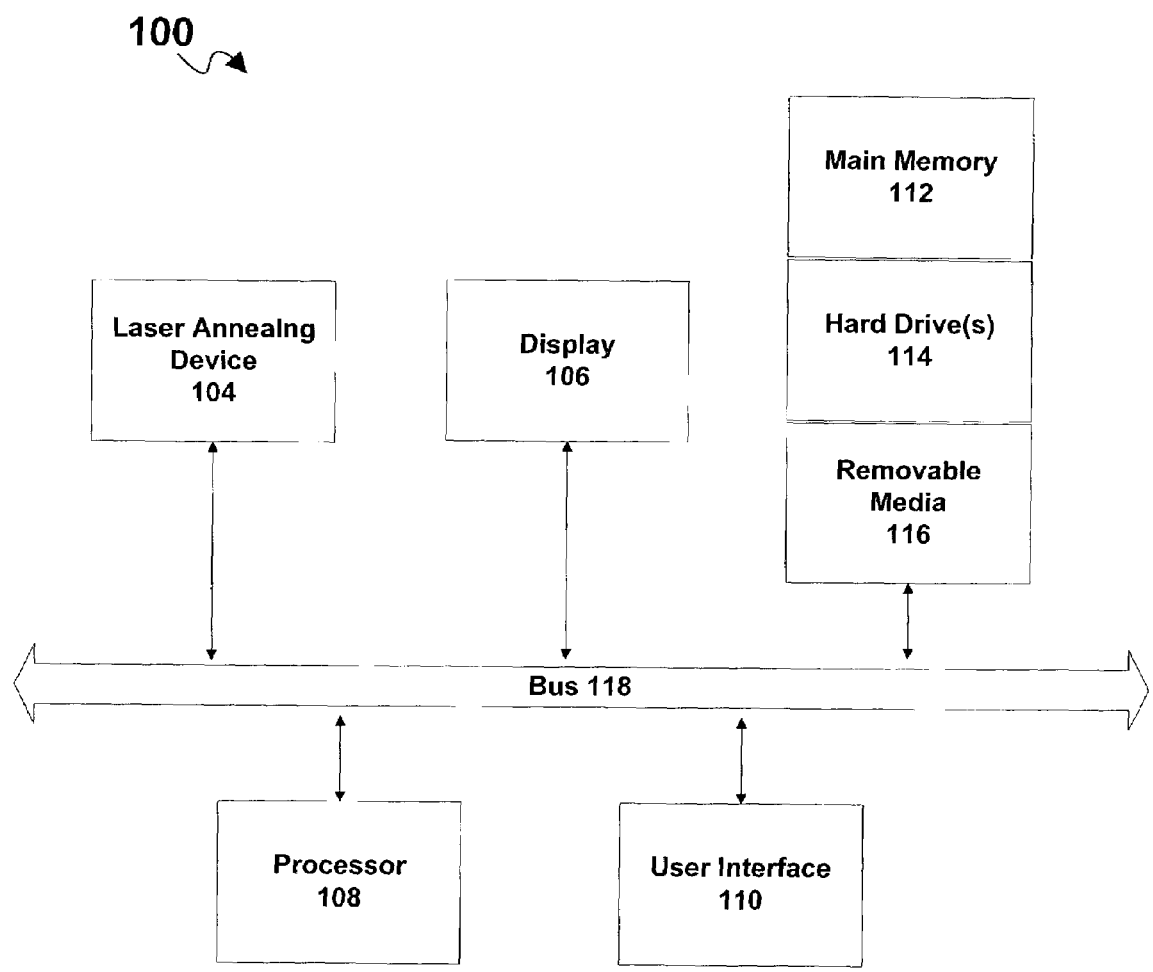
FIG. 1 illustrates a laser annealing system that may be used in accordance with one embodiment of the claimed subject matter.

Referring now in detail to the drawings wherein like parts are designated by like reference numerals throughout, there is illustrated in FIG. 1 a block diagram of a computer-controlled laser annealing system 100, which may be used in accordance with one embodiment of the claimed subject matter. It is important to note, however, that laser annealing system 100 is merely one example of a system that may incorporate one or more embodiments of the claimed subject matter. System 100 incorporates functionality that may be implemented as software executed by a processor, hardware circuits or structures, or a combination thereof. System 100 includes laser annealing device 104, which may be better understood in reference to FIG. 2, below. System 100 may be comprised of at least one processor 108. Processor 108 may execute functionality as disclosed herein, and may be comprised of a general-purpose or dedicated processor, such as a processor from the family of processors made by Intel Corporation, for example. Alternatively, processor 108 may comprise a reduced instruction set computing (RISC) microprocessor, a digital signal processor (DSP), or an application-specific integrated circuit (ASIC), for example.

System 100 further comprises a system bus 118 such as a PCI bus to couple the various components of the system, and may be implemented as a single bus or a combination of buses, for example. System 100 may include one or more memory components, including a main memory 112, which may comprise Random Access Memory (RAM), Synchronous Dynamic Random Access Memory (SDRAM), or Static Random Access Memory (SRAM), for example. System 100 further comprises one or more hard drives 114, and one or more removable media memory components 116 such as floppy diskettes, compact disks (CDs), tape drives, and the like. System 100 may include a display 106, such as a monitor, for example, and may include a user interface 110, which may include a keyboard, mouse, trackball, voice-recognition device, or any other device that permits a system user to input information into and receive information, for example.

Figure 2:
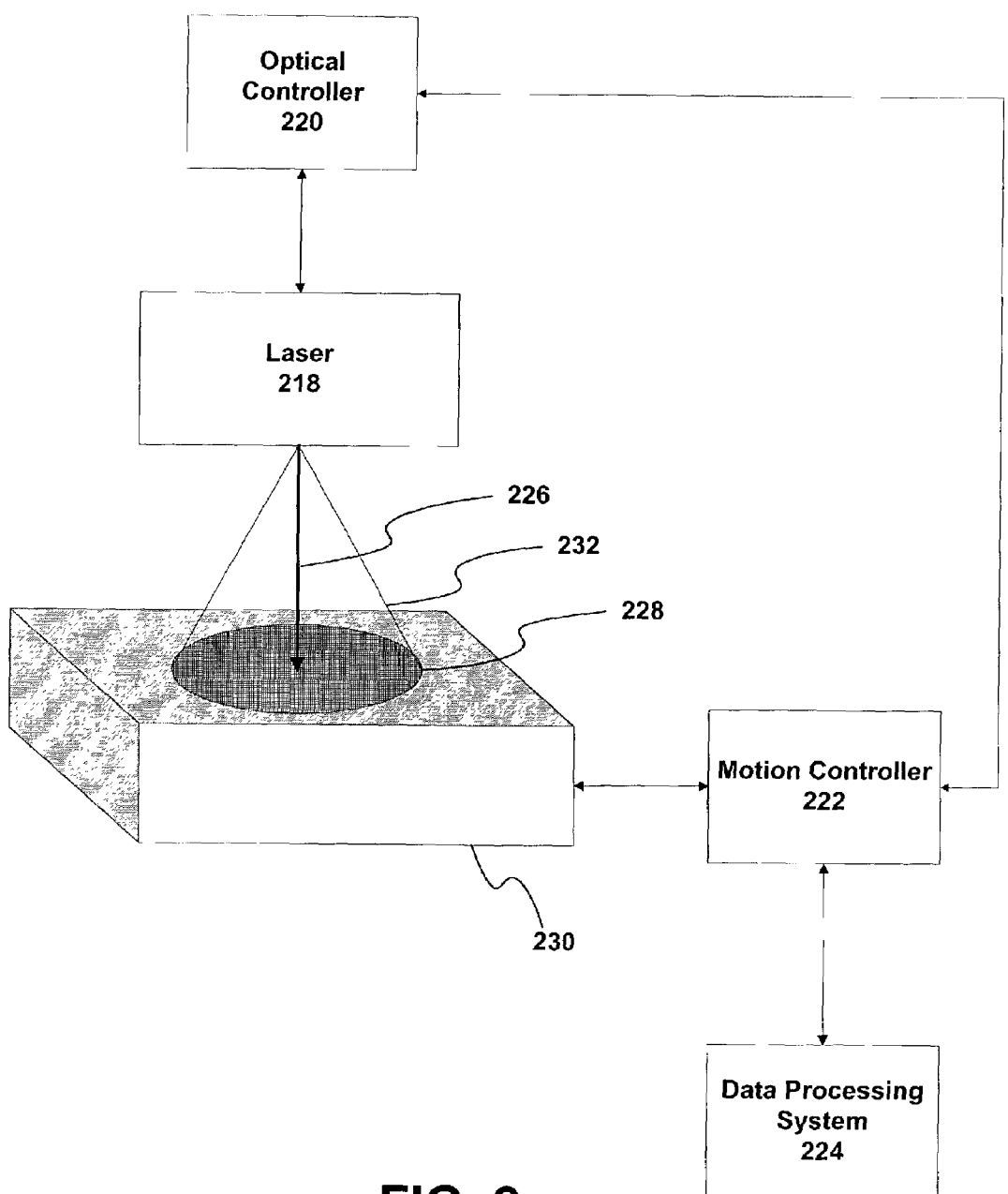
FIG. 2 illustrates a laser annealing tool that may be used in accordance with one embodiment of the claimed subject matter.

FIG. 2 illustrates a more detailed block diagram of laser annealing device 104, which may be used in accordance with one embodiment of the claimed subject matter. It is important to note, however, that laser annealing device 104 is merely one example of a device that may incorporate one or more embodiments of the claimed subject matter, and numerous variations exist. Shown in FIG. 2 is data processing system 224. Data processing system 224 may perform processing by interacting with one or more components of laser annealing device 104, or may additionally interface with one or more components of system 100, for example, in order to perform various functions as described below. Laser annealing device 104 may comprise a wafer support platform 230, on which a silicon wafer 228 may be mounted. Wafer platform 230 may be coupled to a motion controller 222, which may alternatively be at least partially embodied inside wafer platform 230. Motion controller 222 may be coupled to one or more other components of device 104 through a bus, for example (not shown). In operation, Motion controller 222 may receive instructions from one or more software programs contained in memory of system 100, for example, which may be executed by data processing system 224. Motion controller 222 may cause wafer 228 to move to various coordinates, depending on one or more software programs being executed, for example. Alternatively, motion controller 222 maybe capable of controlling the motion of laser 218, or may control the motion of both the platform 230 and the laser 218, for example.

Laser annealing device 104 further comprises a laser 218, which may be capable of generating an optical beam 226 at a particular frequency in the electromagnetic spectrum and having suitable optical power to provide intense localized heating, such as a laser beam, for example. Laser annealing device 104 may also comprise an optical controller 220 coupled to laser 218, which may be configured to perform various functions upon the laser beam 226 generated by laser 218, including shaping the laser beam 226, controlling the fluence of laser beam 226, and moving laser beam 226 within region 232 so that laser beam 226 can contact any point on the exposed upper surface of wafer 228, for example. Laser 226 and optical controller 220 may be controlled by suitable instructions in a computer program that is stored in and executed by data processing system 224, for example.

Figure 3A:
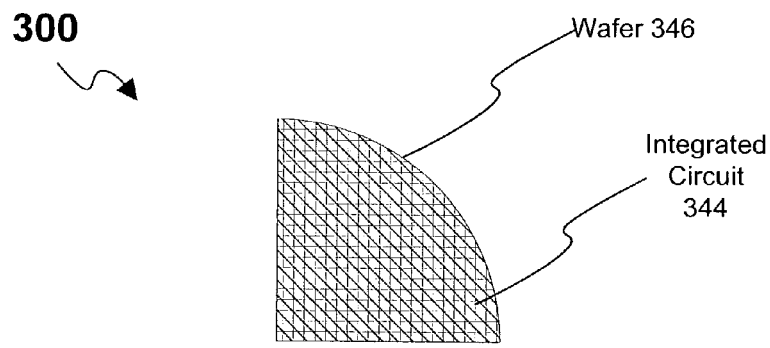
FIG. 3a and FIG. 3b illustrate two devices that may incorporate one embodiment of the claimed subject matter.
Figure 3B:
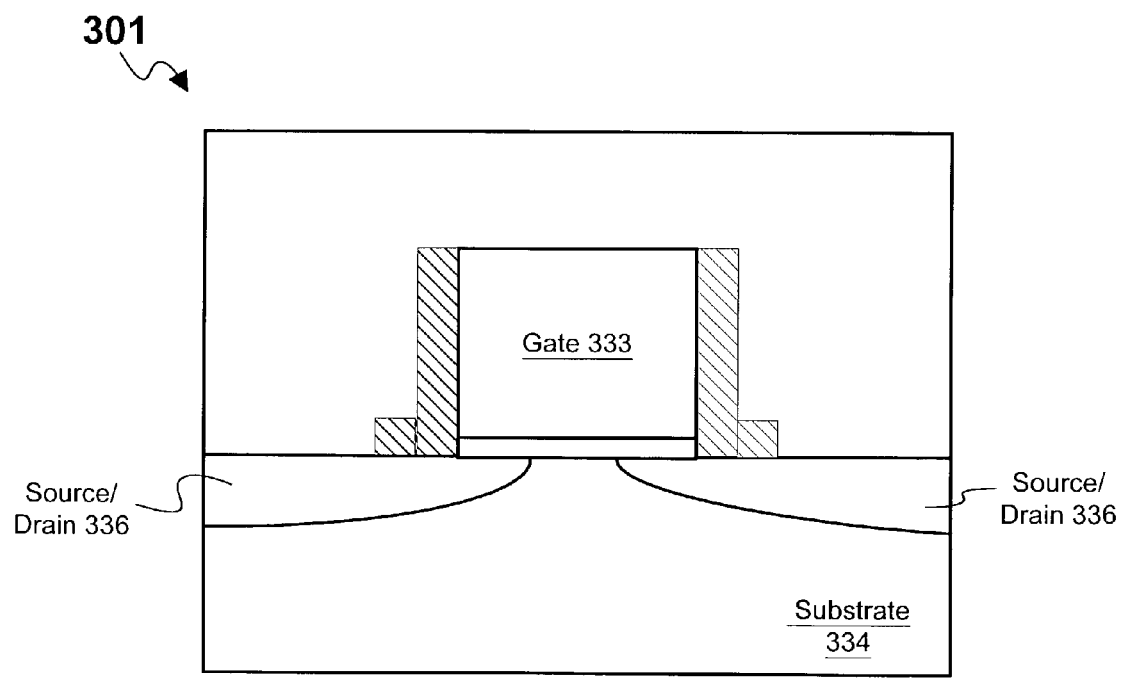

In operation, device 104 may perform one or more annealing functions on a wafer 228. One particular type of laser annealing that device 104 may perform is categorized as pulsed or stepped laser annealing, which may be explained in more detail in reference to FIG. 3a and FIG. 3b. Pulsed or stepped laser annealing may utilize a pulsed laser beam 226 directed at an integrated circuit, such as integrated circuit 344 of FIG. 3a. In operation, the laser beam 226 may pulse sequentially at one or more integrated circuits, or dice, of wafer 346. Typically, the laser beam 226 may be turned on very briefly, e.g. for 20 nanoseconds (ns), and it is then turned off while the beam is stepped to another region of the wafer 346. In the context of a transistor embodied on a die undergoing an annealing process, the exposure of laser beam 226 may cause a phase change (i.e. solid to liquid) of a portion of the substrate 334 of a transistor, such as transistor 301 of FIG. 3b. The phase change may occur in the vicinity of dopant implantation, such as the source/drain regions 336. This may result in the dopant at least partially diffusing through the substrate 334. When the laser source 226 is removed, the substrate 334 will return to a solid phase, with at least a portion of the dopant incorporated into the lattice structure of the substrate in the vicinity of source/drain regions 336, resulting in the formation of a transistor, including gate 333. Desirable characteristics of a transistor, such as transistor 301, may result by using different annealing techniques. For example, shallow source/drain regions may be desirable in high-speed circuitry. Controlling the fluence and/or pulse width of a laser may be a way of controlling the resultant source/drain region depths, resulting in a transistor that exhibits desirable properties.

Transistors of an integrated circuit may be arranged in functional blocks. Functional blocks may be designed to perform varying functions. For example, one block of transistors of an integrated circuit may be used to perform primarily memory functions, and one or more blocks may be used to perform primarily calculation functions. In the design of an integrated circuit comprising one or more blocks of transistors, these different functional blocks may be designed with these particular functions in mind, and it may be desirable to alter one or more of the fabrications processes based on the particular functions that may be performed by a block of transistors when the integrated circuit is implemented in a device. For example, it may be desirable for a block of transistors designated to primarily perform memory functions to be relatively more reliable than other transistors. Similarly, it may be desirable for a block of transistors that primarily perform calculation functions to operate relatively more efficiently or quickly than other transistors. These particular characteristics of different functional blocks may be altered by altering the annealing process performed on the particular functional blocks. For example, providing a deeper source/drain region in a transistor may result in a relatively more reliable transistor than other transistors not being annealed with the altered annealing process. A deeper source/drain region may be fabricated on a transistor by increasing the laser fluence and/or pulse width during a laser annealing process. Similarly, providing a shallow source/drain region in a transistor may result in a relatively faster transistor than other transistors not being annealed with the altered annealing process. A shallower source drain region may be fabricated on a transistor by decreasing the laser fluence and/or pulse width during a laser annealing process.

In one embodiment of the claimed subject matter, one or more blocks of transistors of a single integrated circuit may undergo one or more varying annealing processes, based at least in part on desirable characteristics of the one or more blocks. In this embodiment, a laser annealing device such as device 104 may be incorporated in one or more heat treating processes of the fabrication process of a semiconductor device such as integrated circuit 344. In this particular embodiment, the integrated circuit may be comprised of multiple transistors, such as MOS transistor 301. Integrated circuit 344 may undergo one or more heat treating processes, including laser annealing. Laser annealing may be performed on integrated circuit 344 by laser annealing device 104, for example. In the laser annealing process, the laser annealing process may be altered by one or more of the components of device 104 during annealing of one or more transistors of integrated circuit 344. For example, optical controller 220 may alter the fluence and/or pulse width of the laser for one or more portions of the integrated circuit. Additionally, motion controller 222 may be incorporated to alter one or more characteristics of the annealing process performed on one or more transistors of integrated circuit 344. For example, the motion controller 222 may perform functions resulting in a functional block of the integrated circuit undergoing differing annealing processes than other functional blocks.

For example, in one embodiment of the claimed subject matter, an integrated circuit may be formed on a silicon wafer. The integrated circuit may have one or more blocks of transistors. The one or more blocks of transistors may be designed to perform varying functions when the integrated circuit is implemented in a device. For example, an integrated circuit may contain a memory portion and a computation portion, each made up of multiple transistors. During annealing of the transistors of the integrated circuit, the transistors comprising the memory portion may undergo a laser annealing process wherein the laser operates at a greater fluence and/or duration as compared to other portions. Similarly, the transistors comprising the computation portion may undergo a laser annealing process wherein the laser operates at a lesser fluence and/or duration as compared to other portions. This may result, for example, in an integrated circuit wherein different transistor have different properties such as differing source/drain region depths, for example.

In another embodiment of the claimed subject matter, a laser annealing device may perform varying annealing processes on one or more integrated circuits being formed on a silicon wafer, where the process is varied by altering the laser fluence and/or pulse width, for example. In this embodiment, the processes may be varied based on the desirable characteristics of different functional blocks of an integrated circuit, as well as the location of the integrated circuit being fabricated on the wafer. For example, some integrated circuits being fabricated on a silicon wafer may be designated as "high performance", and may undergo different annealing processes as compared to other integrated circuits. Additionally, some integrated circuits may be designated as more reliable, and may also be fabricated using different annealing processes as compared to other integrated circuits. It is important to note that while several characteristics are referenced in connection to differing annealing processes, the claimed subject matter is not so limited. The claimed subject matter is applicable to any method or apparatus for laser annealing where one or more annealing processes is performed on one or more portions of the semiconductor devices, wherein at least one of the annealing processes is varied based at least in part on the particular portion of the semiconductor device being annealed, and/or on one or more desirable characteristics of the particular portion of the semiconductor device being annealed. Additionally, it is important to note that embodiments of the claimed subject matter are not limited to just laser annealing. For example, it is contemplated that one or more embodiments may incorporate multiple annealing processes, such as a combination of RTA and laser annealing, as just an example.

It can be appreciated that certain embodiments may be applied to the formation of any semiconductor device wherein annealing may be desirable. Additionally, it is important to note that embodiments disclosed herein are not limited to annealing of integrated circuits. For example, embodiments of the claimed subject matter could be used for thermal treatment of optoelectric devices, magnetic devices, or other items where heat treatment may be desirable. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the appended claims are intended to cover all such modifications and changes as fall within the true spirit of the embodiments of the claimed subject matter.

The invention claimed is:

1. A method comprising:
    annealing, with a thermal anneal process, a first dopant implanted region of a first transistor and a second dopant implanted region of a second transistor in an integrated circuit; and
    annealing, with a laser, said second dopant implanted region of said second transistor but not said first dopant implanted region of said first transistor in said integrated circuit, wherein, as a result of annealing with said laser, said first and said second transistors have different dopant implanted region dopant profiles.

2. The method of claim 1 wherein annealing, with said laser, further comprises temporarily changing a transistor substrate from a solid phase to a liquid phase.

3. The method of claim 1 wherein said first transistor is a computation transistor and said second transistor is a memory transistor.

4. The method of claim 1 wherein said second transistor has deeper junctions for reliability and said first transistor has shallower junctions for efficient performance.

5. The method of claim 1 wherein said dopant profiles are defined by activated dopants.

6. A method comprising:
    annealing, with a thermal anneal process, a first implant doped portion of a first semiconductor device, to form a first source/drain region, and a second implant doped portion of a second semiconductor device, to form a second source/drain region, in an integrated circuit, wherein said first source/drain region and said second source/drain region have a first depth; and
    annealing, with a laser, said second implant doped portion of said second semiconductor device but not said first implant doped portion of said second semiconductor device in said integrated circuit to modify the depth of said second source/drain region to a second depth, wherein, as a result of annealing with said laser, said second depth is different from said first depth.

7. The method of claim 6 wherein annealing, with said laser, further comprises temporarily changing a semiconductor device substrate from a solid phase to a liquid phase.

8. The method of claim 6 wherein said first semiconductor device is a computation semiconductor device and said second semiconductor device is a memory semiconductor device.

9. The method of claim 6 wherein said second semiconductor device has deeper junctions for reliability and said first semiconductor device has shallower junctions for efficient performance.

10. The method of claim 6 wherein said dopant profiles are defined by activated dopants.

11. A method comprising:
    annealing, with a thermal anneal process, a first implant doped region and a second implant doped region of a semiconductor; and, subsequently,
    annealing, with a laser, said second implant doped region but not said first implant doped region of said semiconductor wherein, as a result of annealing with said laser, said first implant doped region of said semiconductor has a different dopant profile than said second implant doped region of said semiconductor.

12. The method of claim 11 wherein said first implant doped region of said semiconductor and said second implant doped region of said semiconductor further comprise a first and a second transistor, respectively.

13. The method of claim 11 wherein said dopant profile is defined by activated dopants.

14. A method of forming an integrated circuit comprising:
annealing, with a thermal anneal process, a first dopant implanted region of a first
   transistor and a second dopant implanted region of a second transistor; and, with
   maintaining the concentration of dopants in said first dopant implanted region,
annealing, with a laser, said first dopant implanted region of said first transistor;
varying a laser parameter; and, with maintaining the concentration of dopants in said second implanted region,
annealing, with said laser with said varied parameter, said second dopant implanted region of said second transistor, wherein, as a result of varying said laser parameter, said first and said second transistors have different dopant implanted region dopant profiles.

15. The method of claim 14 wherein said laser parameter is selected from the group consisting of a laser fluence or a laser pulse width.

16. The method of claim 14 wherein annealing, with said laser, further comprises temporarily changing a transistor substrate from a solid phase to a liquid phase.

17. The method of claim 14 wherein said first transistor is a computation transistor and said second transistor is a memory transistor.

18. The method of claim 17 wherein said second transistor has deeper junctions for reliability and said first transistor has shallower junctions for efficient performance.

19. The method of claim 14 wherein said dopant profiles are defined by activated dopants.

* * * * *